(12) United States Patent
Lee

(10) Patent No.: US 9,196,565 B2
(45) Date of Patent: Nov. 24, 2015

(54) FIXING ASSEMBLY

(71) Applicants: Inventec (Pudong) Technology Corporation, Shanghai (CN); INVENTEC CORPORATION, Taipei (TW)

(72) Inventor: Ching-Cheng Lee, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 249 days.

(21) Appl. No.: 14/047,009

(22) Filed: Oct. 6, 2013

(65) Prior Publication Data

US 2014/0353460 A1    Dec. 4, 2014

(30) Foreign Application Priority Data

May 29, 2013    (CN) .......................... 2013 1 0207684

(51) Int. Cl.
    *H01L 23/34*    (2006.01)
    *H05K 7/20*    (2006.01)
    *H01L 23/40*    (2006.01)
    *H01L 23/367*    (2006.01)

(52) U.S. Cl.
    CPC .......... *H01L 23/4006* (2013.01); *F28F 2275/08* (2013.01); *H01L 23/3672* (2013.01); *H01L 2924/0002* (2013.01); *H05K 7/2049* (2013.01); *H05K 2201/066* (2013.01)

(58) Field of Classification Search
    CPC ............ H01L 23/4006; H01L 23/3672; H01L 23/40–23/4093; H01L 24/72; H05K 1/0201–1/0212; H05K 7/20418; H05K 7/2049; F28F 2275/08

USPC .......... 361/704, 709–710, 719; 257/718–719; 165/80.1–80.2; 248/220.21, 222.2, 248/222.14, 560; 411/107, 353; 24/458–459, 520

See application file for complete search history.

(56) References Cited

U.S. PATENT DOCUMENTS

| | | | | |
|---|---|---|---|---|
| 6,542,369 B1 * | 4/2003 | Wu | ...................... | H01L 23/4093 165/185 |
| 6,952,348 B2 * | 10/2005 | Wu | ...................... | H01L 23/4093 257/718 |
| 7,193,853 B2 * | 3/2007 | Chen et al. | .......... | H01L 23/4006 165/80.3 |
| 7,436,671 B2 * | 10/2008 | Chen et al. | .......... | H01L 23/4006 165/185 |
| 7,567,439 B2 * | 7/2009 | Li et al. | ............... | H01L 23/4006 165/104.33 |
| 2014/0161558 A1 * | 6/2014 | Hayashi | .............. | H01L 23/4006 411/366.1 |

* cited by examiner

*Primary Examiner* — Zachary M Pape

(74) *Attorney, Agent, or Firm* — CKC & Partners Co., Ltd.

(57) ABSTRACT

A fixing assembly includes a fixing frame, a fixing member, and a fastening member. The fixing frame includes a frame body and a guiding wall portion. The frame body is disposed between a circuit board and a heatsink. The guiding wall portion is connected to the frame body and has an elongated hole. The thicknesses of the guiding wall portion are reduced toward the frame body. The fixing member abuts against the guiding wall portion and is located over the heatsink. The fixing member has a screw hole communicated with the elongated hole. The fastening member is fastened to the screw hole via the elongated hole. The fastening member is retained by the elongated hole to move relative to the guiding wall portion along the elongated hole, so as to move the fixing member toward or away from the heatsink.

8 Claims, 4 Drawing Sheets

FIXING ASSEMBLY

RELATED APPLICATIONS

This application claims priority to Chinese Patent Application Serial Number 201310207684.8, filed May 29, 2013, which is herein incorporated by reference.

BACKGROUND

1. Field of Invention

The invention relates to a fixing assembly, and more particularly relates to a fixing assembly for fixing a heatsink onto a circuit board.

2. Description of Related Art

In recent years, in order to achieve maximization of economic benefit, computer devices with high efficiency is always the market pursue. In order to improve the processing capability of the computer device as much as possible in the limited space of the computer device, the distribution density of the electronic components in the computer device is gradually increased, continuously taxing the heat dissipation.

For a conventional computer device, on the circuit board thereof are inserted various electronic components, such as a central processing unit (CPU), Northbridge chip and Southbridge chip, display chip, memory module and the like. If heat generated by these electronic components cannot be effectively discharged instantly, it may easily cause the computer device crashed, or even more seriously the circuit board may be burned.

For example, a designer generally installs a heatsink on a heat-generating electronic component (e.g., CPU) of the circuit board, so as to rapidly delivery the heat generated by the heat-generating electronic component to the heatsink fin of the heatsink. Furthermore, the computer device is generally equipped with a fan unit. Main principle of the fan unit is doing work on the air by generating forced convection, so as to cause disturbance of gas modules, such that the heat is taken away from the heatsink fin to cool the heat-generating electronic component.

Currently, the substrate of a conventional heatsink is fixed to a circuit board through buckling of a fixing frame, such that the substrate of the heatsink contacts heat-generating electronic components on the circuit board. However, to for the currently designed fixing frame, since the height of the latch structure thereof is constant, the fixing frame can only be used for buckling a substrate with a specific thickness, not applicable to substrates with other different thicknesses.

In view of the above, it is an issue demanding prompt solution from relevant skill members in the art how to design a fixing assembly applicable to buckling substrates of heatsink with different thicknesses.

SUMMARY

The invention provides a fixing assembly used for fixing a heatsink onto a circuit board. The circuit board includes a heat source, and the heatsink is located over the heat source. The fixing assembly includes a fixing frame, a fixing member and a fastening member. The fixing frame includes a frame body and a guiding wall portion. The frame body is disposed between the circuit board and the heatsink and surrounds the heat source. The guiding wall portion is connected to the frame body and has an elongated hole. The thicknesses of the guiding wall portion are reduced gradually toward the frame body. The fixing member abuts against the guiding wall portion and is located over the heatsink. The fixing member has a screw hole communicated with the elongated hole. The fastening member is fastened to the screw hole via the elongated hole. The fastening member is retained by the elongated hole to move relative to the guiding wall portion along the elongated hole, so as to move the fixing member toward or away from the heatsink.

In an embodiment of the invention, the aforesaid frame body has a first surface and a second surface which are opposite to each other. The first surface faces the circuit board. The guiding wall portion is connected to an edge of the second surface.

In an embodiment of the invention, the aforesaid guiding wall portion has an inner surface and an outer surface. The elongated hole is used for communicating the inner surface and the outer surface. The fixing member abuts against the inner surface. The outer surface is perpendicular to the second surface.

In an embodiment of the invention, the aforesaid elongated hole has a major axis on the outer surface, and thus the major axis is perpendicular to the second surface.

In an embodiment of the invention, the aforesaid guiding wall portion further has a side surface. The side surface is perpendicular to the second surface, and is connected between the inner surface and the outer surface. The fixing member includes a fixing portion and an extending portion. The fixing portion abuts against the inner surface, and has a buckling surface. The buckling surface is used for buckling the heatsink. The screw hole is formed on the fixing portion. The extending portion is connected to the fixing portion and abuts against the side surface, such that the buckling surface is kept parallel to the heatsink when the fixing member is moving relative to the guiding wall portion.

In an embodiment of the invention, the thicknesses of the aforesaid fixing portion are gradually increased toward the buckling surface.

In an embodiment of the invention, the aforesaid heatsink has a first throughhole. The frame body has a second throughhole. The fixing assembly further includes a tightening member and a spring. The tightening member is fastened to the circuit board by sequentially passing through the first throughhole and the second throughhole. The spring is hitched to the tightening member and is compressed by the tightening member and the heatsink, such that the heatsink abuts tightly against the heat source.

In an embodiment of the invention, the aforesaid tightening member includes a rod body, a fastening portion and a retaining portion. The rod body slidably passes through the first throughhole and the second throughhole. The spring is hitched to the rod body. The fastening portion is connected to one end of the rod body, so as to be fastened to the circuit board. The retaining portion is connected to the other end of the rod body. The size of the retaining portion is greater than the size of the first throughhole, and the spring is compressed between the retaining portion and the heatsink.

In view of the above, for the fixing assembly of the invention, the thicknesses of the guiding wall portion of the fixing frame are gradually reduced toward the frame body, and the elongated hole which can enable the fastening member to move along a specific direction (e.g., toward the frame body) is opened correspondingly on the guiding wall portion, such that when the fastening member is continuously fastened to the fixing member, the fixing member moves toward the frame body as guided by the guiding wall portion and the elongated hole and thus is buckled to the substrate of heatsink located over the frame body. Therefore, the fixing frame included in the fixing assembly of the invention can be applicable to buckling substrates of heatsink with different thicknesses without hindrance, not requiring to modifying design of the fixing frame specially based on the thickness specification of the substrate. Additionally, the fixing member of the invention further includes the extending to portion which abuts against the side surface of the guiding wall portion, such that when the fastening member is continuously fastened to the fixing member, the buckling surface of the fixing member can be protected from imprecisely buckling the substrate of the heatsink due to unpredictable rotation of the fixing member.

DETAILED DESCRIPTION

Figure 1:
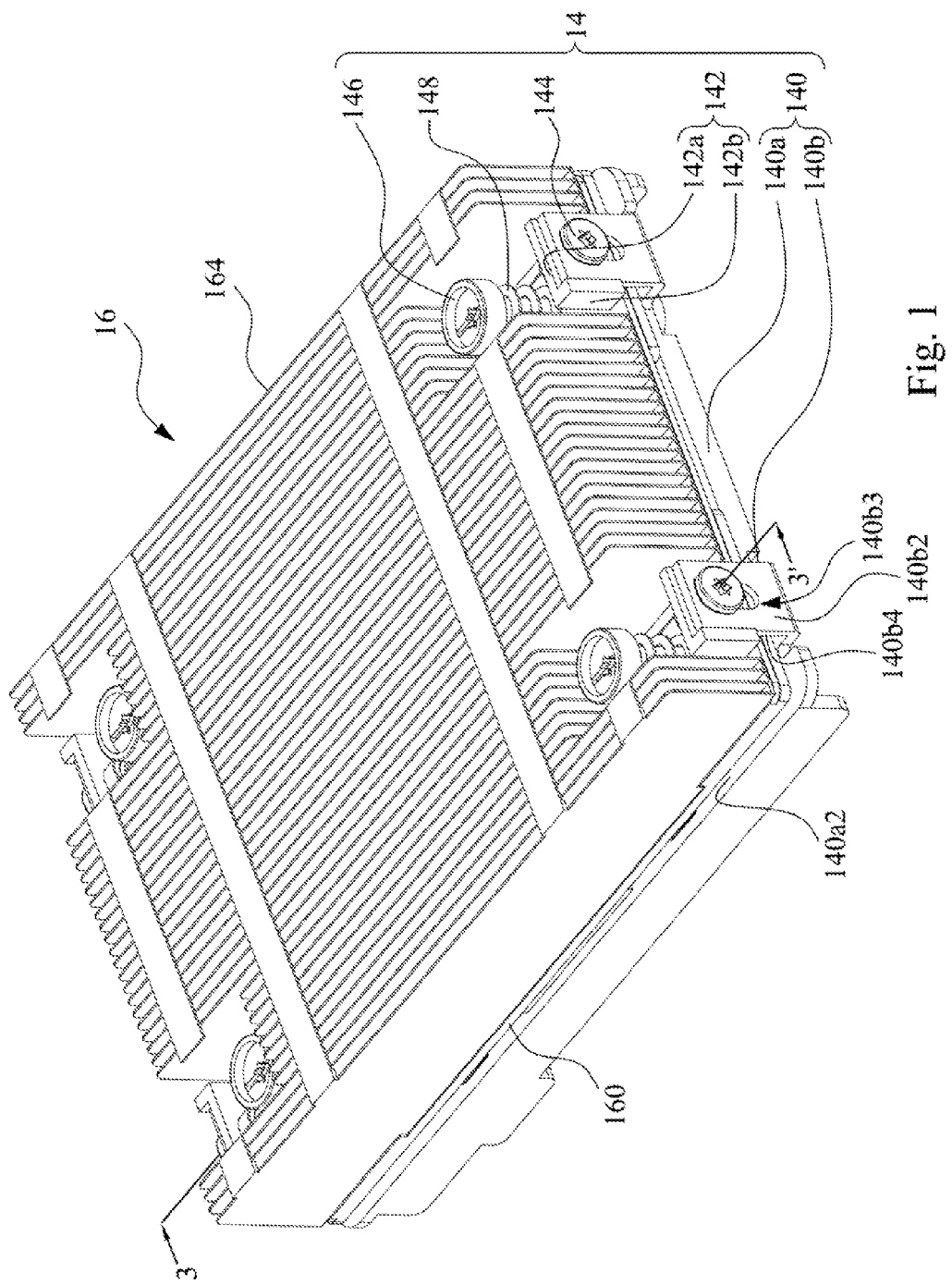
FIG. 1 is a perspective view of a fixing assembly and a heatsink according to an embodiment of the invention.

A plurality of embodiments of the invention is disclosed below with reference to the drawings. For purpose of clear illustration, various practical details will be illustrated along with other things in the description below. However, it should be understood that the invention is not limited to these practical details. In other words, in some embodiments of the invention these details in practice are unnecessary. Furthermore, for purpose of simplifying the drawings, some conventional common structures and elements are illustrated in the drawings in a simply schematic manner.

Figure 2:
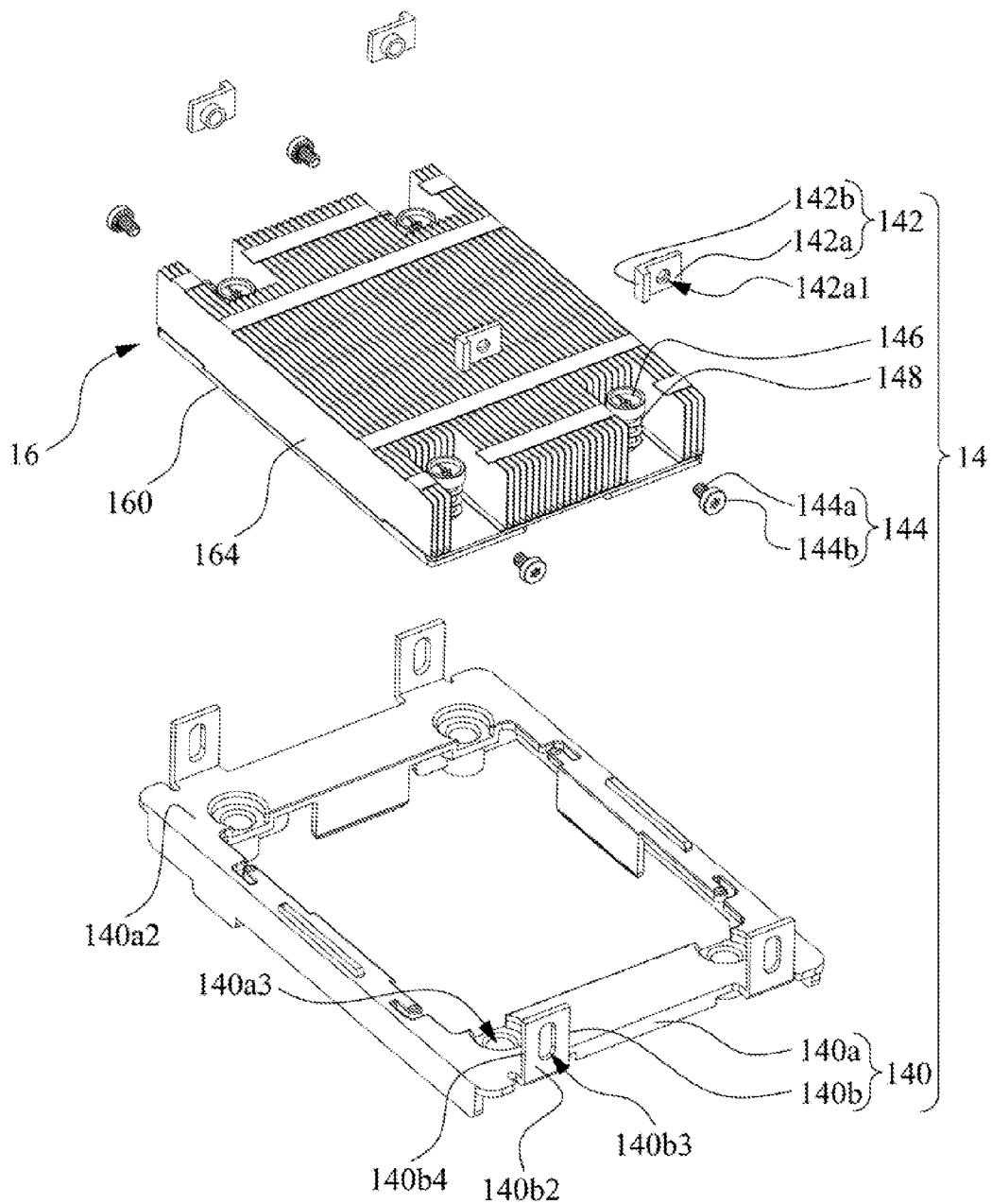
FIG. 2 is an exploded view of the fixing assembly and the heatsink in FIG. 1.
Figure 3:
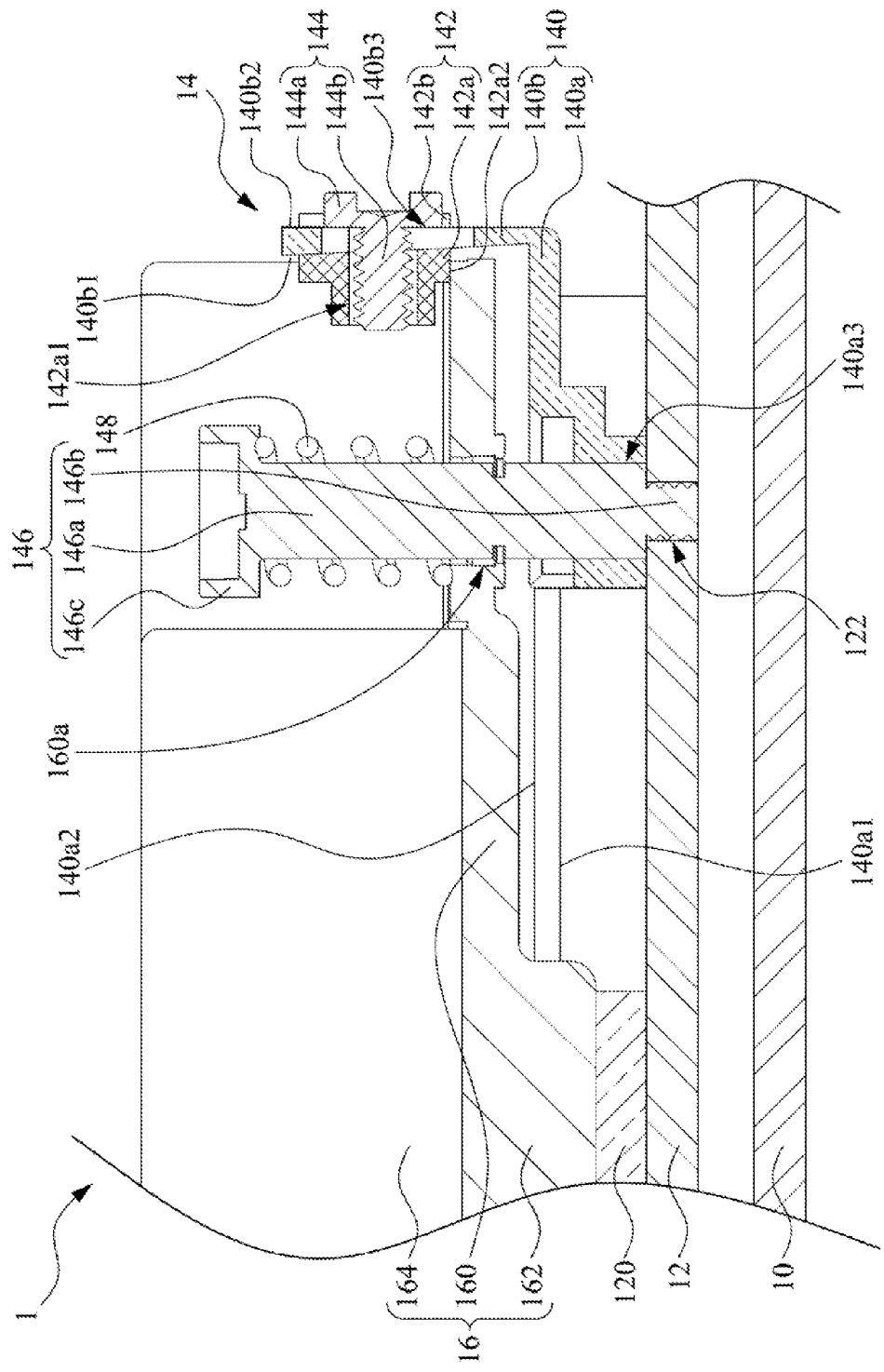
FIG. 3 is a sectional view of the fixing assembly and the heatsink in FIG. 1 arranged in a computer device along line 3-3.

References are made to FIGS. 1, 2 and 3. FIG. 1 is a perspective view of a fixing assembly 14 and a heatsink 16 according to an embodiment of the invention. FIG. 2 is an exploded view of the fixing assembly 14 and the heatsink 16 in FIG. 1. FIG. 3 is a sectional view of the fixing assembly 14 and the heatsink 16 in FIG. 1 arranged in a computer device 1 along line 3-3.

As shown in FIG. 3, in this embodiment the computer device 1 includes a housing case 10, a circuit board 12, a fixing assembly 14 and a heatsink 16. The circuit board 12 of the computer device 1 is disposed in the housing case 10 and includes a heat source 120, and the heatsink 16 is located over the heat source 120. In practical application, the heat source 120 disposed on the circuit board 12 may be a central processing unit (CPU), Northbridge chip and Southbridge chip, display chip, memory module, power module and the like, but the invention is not limited to this.

As shown in FIGS. 1-3, in this embodiment the fixing assembly 14 of the computer device 1 includes a fixing frame 140. The fixing frame 140 of the fixing assembly 14 includes a frame body 140a. The frame body 140a of the fixing frame 140 is disposed between the circuit board 12 and the heatsink 16, and surrounds the heat source 120. The frame body 140a of the fixing frame 140 has a first surface 140a1 and a second surface 140a2 that are opposite to each other. The first surface 140a1 of the frame body 140a faces the circuit board 12. The heatsink 16 includes a substrate 160. The substrate 160 of the heatsink 16 is located over the second surface 140a2 of the frame body 140a.

Furthermore, as shown in FIG. 3 the heatsink 16 of the computer device 1 further includes a heat conducting portion 162 and a plurality of heatsink fins 164. In the heatsink 16, the heat conducting portion 162 is disposed on bottom of the substrate 160 and runs out into the center of the frame body 140a of the fixing frame 140, and further contacts the heat source 120 on the circuit board 12 in large areas. The heatsink fin 164 of the heatsink 16 is disposed on top of the substrate 160. Therefore, the heatsink 16 can absorb heat from the heat source 120 on the circuit board 12 via the heat conducting portion 162, and transmit the heat to the heatsink fin 164 via the substrate 160 in a heat conduction manner, and then the surface of the heatsink fin 164 exchanges heat with ambient air in a thermal convection manner to achieve the effect of heat dissipation.

Similarly as shown in FIGS. 1-3, the fixing assembly 14 of the computer device 1 further includes a fixing member 142 and a fastening member 144. The fixing frame 140 of the fixing assembly 14 further includes a guiding wall portion 140b. The guiding wall portion 140b of the fixing frame 140 is connected to the frame body 140a (particularly connected to the edge of the second surface 140a2), and has an inner surface 140b1, an outer surface 140b2 and an elongated hole 140b3. The elongated hole 140b3 of the guiding wall portion 140b communicates the inner surface 140b1 and the outer surface 140b2. The fixing member 142 of the fixing assembly 14 abuts against the inner surface 140b1 of the guiding wall portion 140b, and is located over the substrate 160 of the heatsink 16. The fixing member 142 of the fixing assembly 14 includes a fixing portion 142a, wherein the fixing portion 142a has a screw hole 142a1.

Figure 4:
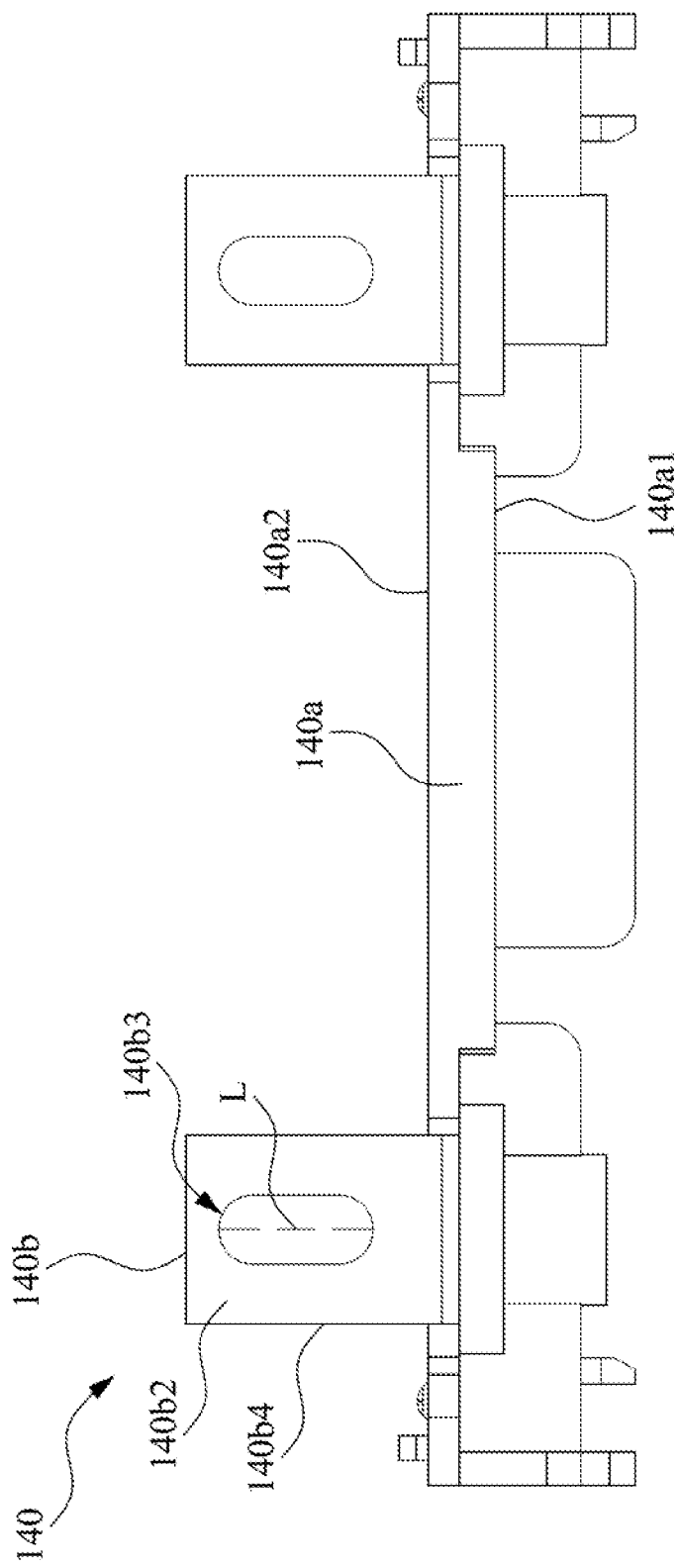
FIG. 4 is a side view of the fixing frame in FIG. 2.

FIG. 4 is a side view of the fixing frame 140 in FIG. 2. As shown in FIG. 4 and with reference to FIGS. 1-3, in this embodiment the elongated hole 140b3 of the guiding wall portion 140b has a major axis L on the outer surface 140b2. The fastening member 144 of the fixing assembly 14 includes a threaded portion 144a and a head portion 144b connected to each other. The length of the elongated hole 140b3 of the guiding wall portion 140b along a direction parallel to the major axis L is greater than both the diameter of the head portion 144b and the diameter of the threaded portion 144a in the fastening member 144. The width of the elongated hole 140b3 along a direction perpendicular to the major axis L is greater than the diameter of the threaded portion 144a, but smaller than the diameter of the head portion 144b in the fastening member 144. Therefore, for the fastening member 144 of the fixing assembly 14, the threaded portion 144a thereof can pass from the outer surface 140b2 of the guiding wall portion 140b through the elongated hole 140b3 to go out from the inner surface 140b1 of the guiding wall portion 140b; while the head portion 144b of the fastening member 144 cannot pass through the elongated hole 140b3 and only abuts against the outer surface 140b2.

When the screw hole 142a1 of the fixing portion 142a is communicated with the elongated hole 140b3 of the guiding wall portion 140b as the fixing portion 142a of the fixing member 142 abuts against the guiding wall portion 140b of the fixing frame 140, the threaded portion 144a of the fastening member 144 can be fastened to the screw hole 142a1 via the elongated hole 140b3. Under this case the threaded portion 144a of the fastening member 144 is retained by the elongated hole 140b3 of the guiding wall portion 140b so as to only move relative to the guiding wall portion 140b along the elongated hole 140b3, and the fixing member 142 fastened to the fastening member 144 moves toward or away from the substrate 160 of the heatsink 16 as driven by the fastening member 144.

Here it should be noted that in this embodiment the thicknesses of the guiding wall portion 140b of the fixing frame 140 are gradually reduced toward the frame body 140a. On the one hand, when the fastening member 144 of the fixing assembly 14 is continuously fastened to the screw hole 142a1 of the fixing portion 142a, the distance between the head portion 144b of the fastening member 144 and the fixing portion 142a of the fixing member 142 is continuously reduced, so that the fastening member 144 and the fixing member 142 move along the direction in which the thicknesses of the guiding wall portion 140b are gradually reduced (i.e., toward the frame body 140a). On the other hand, since the threaded portion 144a of the fastening member 144 is retained by the elongated hole 140b3 of the guiding wall portion 140b, when moving along the direction in which the thicknesses of the guiding wall portion 140b are gradually reduced the fastening member 144 and the fixing member 142 are also guided by the elongated hole 140b3. In other words, the fixing member 142 of the fixing assembly 14 is buckled toward the substrate 160 of the heatsink 16 as guided by the guiding wall portion 140b (one factor is the thicknesses of the guiding wall portion 140b, and the other factor is the elongated hole 140b3), such that the heat conducting portion 162 of the heatsink 16 abuts tightly against the heat source 120 on the circuit board 12.

In this embodiment, the major axis L of the elongated hole 140b3 is perpendicular to the second surface 140a2 of the frame body 140a. However the invention is not limited to this. In practical application, as long as the major axis L of the elongated hole 140b3 is not parallel to the second surface 140a2 of the frame body 140a, when the fastening member 144 of the fixing assembly 14 is continuously fastened to the screw hole 142a1 of the fixing portion 142a, the fastening member 144 moves toward the second surface 140a2 of the frame body 140a as guided by the guiding wall portion 140b, and is buckled to the substrate 160 of the heatsink 16.

As shown in FIG. 3, in this embodiment the outer surface 140b2 of the guiding wall portion 140b is perpendicular to the second surface 140a2 of the frame body 140a, and the inner surface 140b1 of the guiding wall portion 140b is inclined toward the heatsink 16 along a direction away from the second surface 140a2. However the invention is not limited to this. In practical application, if it is intended to achieve the effect that the fixing member 142 moves toward or away from the substrate 160 of the heatsink 16 vertically, the inner surface 140b1 of the guiding wall portion 140b may be enabled to be perpendicular to the second surface 140a2 of the frame body 140a, and the outer surface 140b2 of the guiding wall portion 140b is enabled to be inclined away from the heatsink 16 along a direction away from the second surface 140a2.

As shown in FIGS. 1, 3 and 4, in this embodiment the guiding wall portion 140b of the fixing frame 140 also has a side surface 140b4. The side surface 140b4 of the guiding wall portion 140b is perpendicular to the second surface 140a2 of the frame body 140a, and is connected between the inner surface 140b1 and the outer surface 140b2. The fixing member 142 of the fixing assembly 14 also includes an extending portion 142b. The fixing portion 142a of the fixing member 142 also has a buckling surface 142a2. The buckling surface 142a2 of the fixing portion 142a is buckled to the substrate 160 of the heatsink 16. The extending portion 142b of the fixing member 142 is connected to the fixing portion 142a, and abuts against the side surface 140b4 of the guiding wall portion 140b. Since the major axis L of the elongated hole 140b3 and the side surface 140b4 of the guiding wall portion 140b are both perpendicular to the second surface 140a2 of the frame body 140a (as shown in FIG. 4), when the fixing member 142 moves relative to the guiding wall portion 140b of the fixing frame 140, the buckling surface 142a2 of the fixing portion 142a can be kept parallel to the substrate 160 of the heatsink 16.

As shown in FIG. 3, in this embodiment the thicknesses of the fixing portion 142a of the fixing member 142 are gradually increased toward the buckling surface 142a2, but the invention is not limited to this.

Similarly as shown in FIG. 3, in this embodiment the heatsink 16 of the computer device 1 also has a first throughhole 160a, which is formed on the substrate 160 of the heatsink 16. The frame body 140a of the fixing frame 140 also has a second throughhole 140a3, which communicates the first surface 140a1 and the second surface 140a2. The circuit board 12 has a fastening hole 122. The fixing assembly 14 also includes a tightening member 146 and a spring 148. The tightening member 146 of the fixing assembly 14 is fastened to the fastening hole 122 on the circuit board 12 by sequentially passing through the first throughhole 160a of the substrate 160 and the second throughhole 140a3 of the frame body 140a. The spring 148 of the fixing assembly 14 is hitched to the tightening member 146, and is compressed by the tightening member 146 and the substrate 160 of the heatsink 16, such that the heat conducting portion 162 of the heatsink 16 abuts tightly against the heat source 120.

Furthermore, the tightening member 146 of the fixing assembly 14 includes a rod body 146a, a fastening portion 146b and a retaining portion 146c. The rod body 146a of the tightening member 146 moveably passes through the first throughhole 160a of the substrate 160 and the second throughhole 140a3 of the frame body 140a. The spring 148 of the fixing assembly 14 is hitched to the rod body 146a of the tightening member 146. The fastening portion 146b of the tightening member 146 is connected to one end of the rod body 146a, so as to be fastened to the fastening hole 122 on the circuit board 12. The retaining portion 146c of the tightening member 146 is connected to the other end of the rod body 146a. The size of the retaining portion 146c is greater than the size of the first throughhole 160a (for example, the diameter of the retaining portion 146c is greater than that of the first throughhole 160a), and the spring 148 is compressed between the retaining portion 146c and the substrate 160 of the heatsink 16. Therefore, the compressed spring 148 can generate enough down force to push the heatsink 16 toward the circuit board 12, such that the heat conducting portion 162 of the heatsink 16 can press against the heat source 120 more tightly, which further increases the heat conduction capability of the heatsink 16 for the heat source 120.

It can be seen apparently from the aforesaid detailed description of specific embodiments of the invention that, for the fixing assembly of the present invention, the thicknesses of the guiding wall portion of the fixing frame is gradually reduced toward the frame body, and the elongated hole which can enable the fastening member to move along a specific direction (e.g., toward the frame body) is opened correspondingly on the guiding wall portion, such that when the fastening member is continuously fastened the fixing member, the fixing member moves toward the frame body as guided by the guiding wall portion and the elongated hole and thus is buckled to the substrate of heatsink located over the frame body. Therefore, the fixing frame included in the fixing assembly of the present invention can be applicable to buckling substrates of heatsink with different thicknesses without hindrance, not requiring to modifying design of the fixing frame specially based on the thickness specification of the substrate. Additionally, the fixing member of the invention further includes the extending portion which abuts against the side surface of the guiding wall portion, such that when the fastening member is fastening the fixing member continuously, the buckling surface of the fixing member can be protected from imprecisely buckling the substrate of the heatsink due to unpredictable rotation of the fixing member.

Although the invention has been disclosed with reference to the above embodiments, these embodiments are not intended to limit the invention. It will be apparent to those of skills in the art that various modifications and variations can be made without departing from the spirit and scope of the invention. Therefore, the scope of the invention shall be defined by the appended claims.

What is claimed is:

1. A fixing assembly for fixing a heatsink onto a circuit board, wherein the circuit board comprises a heat source, and the heatsink is located over the heat source, and the fixing assembly comprises:
   a fixing frame, comprising:
      a frame body disposed between the circuit board and the heatsink and surrounding the heat source; and
      a guiding wall portion connected to the frame body and having an elongated hole, wherein the thicknesses of the guiding wall portion are gradually reduced toward the frame body;
   a fixing member abutting against the guiding wall portion and located over the heatsink, wherein the fixing member has a screw hole communicated with the elongated hole; and
   a fastening member fastened to the screw hole via the elongated hole, wherein the fastening member is retained by the elongated hole to move relative to the guiding wall portion along the elongated hole, so as to move the fixing member toward or away from the heatsink.

2. The fixing assembly of claim 1, wherein the frame body has a first surface and a second surface opposite to each other, the first surface faces the circuit board, and the guiding wall portion is connected to the edge of the second surface.

3. The fixing assembly of claim 2, wherein the guiding wall portion has an inner surface and an outer surface, the elongated hole communicates the inner surface and the outer surface, the fixing member abuts against the inner surface, and the outer surface is perpendicular to the second surface.

4. The fixing assembly of claim 3, wherein the elongated hole has a major axis on the outer surface, and the major axis is perpendicular to the second surface.

5. The fixing assembly of claim 4, wherein the guiding wall portion further has a side surface, the side surface is perpendicular to the second surface and connected between the inner surface and the outer surface, and the fixing member comprises:
   a fixing portion abutting against the inner surface and having a buckling surface for buckling the heatsink, wherein the screw hole is formed on the fixing portion; and
   an extending portion connected to the fixing portion and abutting against the side surface, so as to make the buckling surface be kept parallel to the heatsink when the fixing member moves relative to the guiding wall portion.

6. The fixing assembly of claim 5, wherein the thicknesses of the fixing portion are gradually increased toward the buckling surface.

7. The fixing assembly of claim 1, wherein the heatsink has a first throughhole, the frame body has a second throughhole, and the fixing assembly further comprises:
   a tightening member fastened to the circuit board by sequentially passing through the first throughhole and the second throughhole; and
   a spring hitched to the tightening member and compressed by the tightening member and the heatsink, so as to make the heatsink abut tightly against the heat source.

8. The fixing assembly of claim 7, wherein the tightening member comprises:
   a rod body slidably passing through the first throughhole and the second to throughhole, wherein the spring is hitched to the rod body;
   a fastening portion connected to one end of the rod body so as to be fastened to the circuit board; and
   a retaining portion connected to the other end of the rod body, wherein the size of the retaining portion is greater than the size of the first throughhole, and the spring is compressed between the retaining portion and the heatsink.

* * * * *